United States Patent [19]
Yatagai

[11] Patent Number: 5,546,032
[45] Date of Patent: Aug. 13, 1996

[54] CLOCK SIGNAL REGENERATION METHOD AND APPARATUS

[75] Inventor: Tetsuya Yatagai, Tokyo, Japan

[73] Assignee: NEC Corporation, Tokyo, Japan

[21] Appl. No.: 361,568

[22] Filed: Dec. 22, 1994

[30] Foreign Application Priority Data

Dec. 25, 1993 [JP] Japan .................. 5-348154

[51] Int. Cl.⁶ .............. H03L 7/00; H03K 5/153
[52] U.S. Cl. .................... 327/165; 327/141; 327/156
[58] Field of Search .................... 327/141, 145–147, 327/150, 151, 155, 156, 159, 162, 163, 165–167, 184, 178; 331/14, 15, 17, 25; 375/326

[56] References Cited

U.S. PATENT DOCUMENTS

| | | | |
|---|---|---|---|
| 3,824,498 | 7/1974 | McBride | 332/9 R |
| 4,352,999 | 10/1982 | Galpin | 327/78 |
| 4,484,296 | 11/1984 | Treise et al. | 327/141 |
| 4,694,196 | 9/1987 | Hasley et al. | 307/269 |
| 4,891,598 | 1/1990 | Yoshida et al. | 327/167 |
| 4,929,849 | 5/1990 | Paul | 327/155 |
| 5,220,220 | 6/1993 | Tse et al. | 327/78 |
| 5,282,223 | 1/1994 | Muramatsu | 327/165 |
| 5,339,303 | 8/1994 | Yoshimaru | 327/77 |
| 5,397,945 | 3/1995 | Shum et al. | 327/77 |
| 5,408,687 | 4/1995 | Ooga | 331/25 |
| 5,436,583 | 7/1995 | Fujii et al. | 327/165 |

FOREIGN PATENT DOCUMENTS

| | | |
|---|---|---|
| 0459446A1 | 5/1991 | European Pat. Off. . |
| 358047324 | 3/1983 | Japan ........... 327/165 |
| 363238722 | 10/1988 | Japan ........... 327/165 |
| 1-270428 | 10/1989 | Japan . |
| 4-49717 | 3/1992 | Japan . |
| 2160375 | 12/1985 | United Kingdom . |
| 2215539 | 9/1989 | United Kingdom . |

*Primary Examiner*—Timothy P. Callahan
*Assistant Examiner*—T Lam
*Attorney, Agent, or Firm*—Foley & Lardner

[57] ABSTRACT

A clock signal regeneration method and apparatus by which the phase of a regenerated clock signal can be controlled with a step smaller than the width of one clock of a controlling clock signal to improve the accuracy in rate of the regenerated clock signal is disclosed. The apparatus comprises a timing extraction circuit for extracting, from the received data, a timing signal corresponding to a rate of the received data, a phase comparator for comparing the phases of the timing signal and a regenerated clock signal to produce a phase difference signal, an integrator for repetitively adding the phase difference signal at each clock of the regenerated clock signal in a cycle of a controlling clock signal whose frequency is higher than that of the timing signal to produce a phase difference integrated value for each of such adding operation, a sine wave regenerating ROM for converting the phase difference integrated value into amplitude information by which an amplitude of a sine waveform is represented in a digital value, a D/A converter for converting the amplitude information into an analog signal, and a comparator for comparing the analog signal with a reference voltage to produce a new regenerated clock signal.

15 Claims, 8 Drawing Sheets

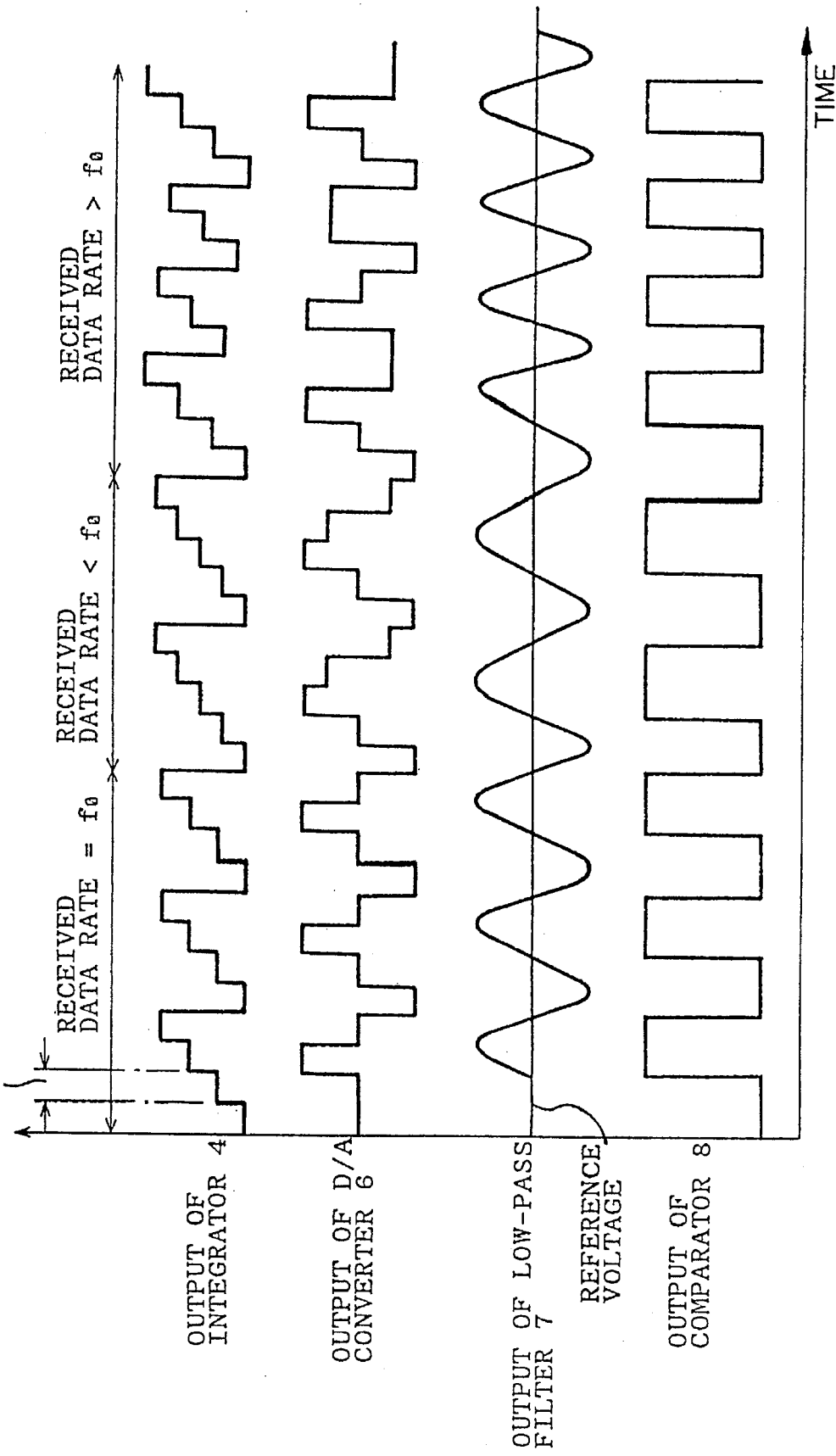

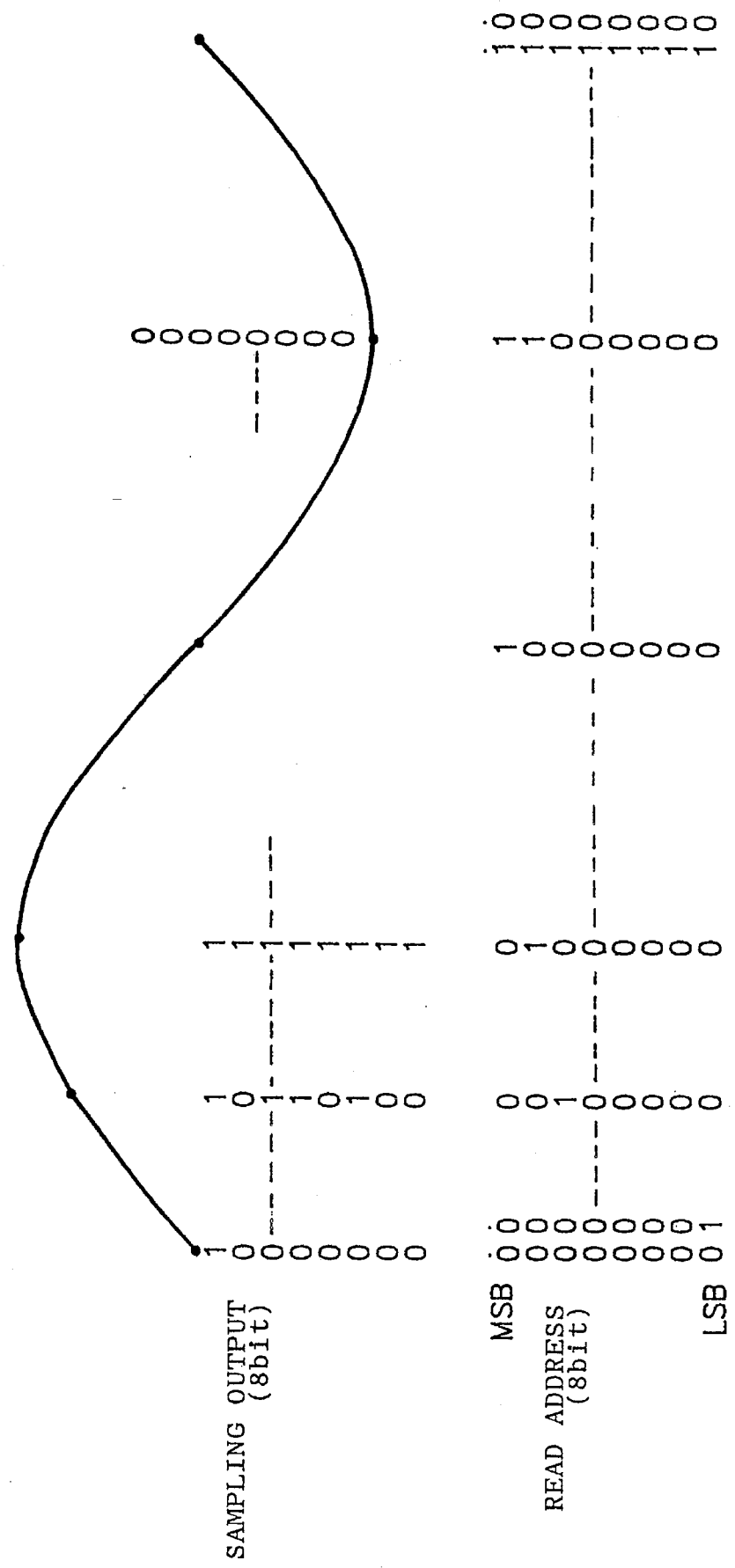

5,546,032

CLOCK SIGNAL REGENERATION METHOD AND APPARATUS

BACKGROUND OF THE INVENTION

1. Field of the Invention

This invention relates to a clock signal regeneration method and apparatus for regenerating a clock signal synchronized with received data, and more particularly to a clock signal regeneration method and apparatus for use in the field of digital radio communications wherein, from received data, a timing signal corresponding to the rate of the received data is extracted and compared in phase with a regenerated clock signal outputted from the clock signal regeneration apparatus to produce a phase difference signal corresponding to the difference in phase between the timing signal and the regenerated clock signal and then the phase of the regenerated clock signal is corrected based on the phase difference signal.

2. Description of the Related Art

Such a clock signal regeneration apparatus as shown in FIG. 8 is conventionally known as a clock signal regeneration apparatus which employs a phase locked loop (PLL). Referring to FIG. 8, the clock signal regeneration apparatus shown includes a timing extraction circuit 101 for extracting, from received data, a timing signal corresponding to the rate of the received data, a phase comparator 102 for comparing the phases of the timing signal extracted by the timing extraction circuit 101 and a regenerated clock signal outputted from the clock signal regeneration apparatus with each other and outputting a phase difference signal of a voltage corresponding to the phase difference, a loop filter (low-pass filter) 103 for removing high frequency components from the phase difference signal from the phase comparator 102, an addition/subtraction control circuit 104, a count value correction circuit 105, and a counter 106 for counting pulses of a controlling clock signal (FAST CLOCK) having a frequency N times that of the timing signal.

The addition/subtraction control circuit 104 outputs, in response to a phase difference voltage outputted from the loop filter 103, a signal indicating whether the count value of the counter 106 should be incremented or decremented by one. The count value correction circuit 105 corrects the current count value of the counter 106 in response to the output of the addition/subtraction control circuit 104 and loads the thus corrected count value into the counter 106 in response to the regenerated clock signal of the clock signal regeneration apparatus.

By the operation just described, the counter 106 modifies its count value in accordance with a phase difference between the timing signal extracted from the received data and the regenerated clock signal, and controls the phase of the regenerated clock signal with a step equal to 1/N of the step at the data rate of the received data. This operation plays the role of a voltage controlled oscillator (VCO) of a PLL circuit so that a clock signal corresponding to the rate of the received data is regenerated.

The phase control of the regenerated clock signal of the conventional apparatus described above, however, has an upper limit defined by the width of one clock of the controlling clock signal and only allows phase control in minimum units of the thus limited fixed width. In particular, where the controlling clock signal has a rate equal to N times the data rate, the phase of the regenerated clock signal cannot be corrected with a step smaller than 1/N of the step at the data rate. This relationship is illustrated in a time chart of FIG. 9. Referring to FIG. 9, where the data are such as illustrated by the curve (1), the curve (2) illustrates a regenerated clock signal which is displaced in phase from the data signal by an amount equal to a minimum phase control width α of one step while the curve (3) illustrates another regenerated clock signal which is corrected optimally in phase. In this instance, the minimum phase control width α is equal to 1/N of the width of one symbol of the data, or in other words, equal to the width of one clock of the controlling clock signal.

Accordingly, in a system in which a large amount of data is processed at a high speed, when the rate of data is so high that the ratio "N" between the symbol rate of the data (the symbol rate signifies the number of symbols which can be transmitted within one second; the symbol rate is equal to the bit rate where the data are binary digital modulation data, but is equal to ½ the bit rate where the data are four-value digital modulation data) and the rate of the controlling clock signal cannot be set high, the regenerated clock signal exhibits high phase jitters, and consequently, a high performance of the system cannot be assured. Further, if it is intended to suppress the phase jitters of the regenerated clock signal, then the frequency of the controlling clock signal must be set extremely high. For example, if it is tried to suppress phase jitters within 3° with the data rate of 2.5 Mb/s, then the frequency of the controlling clock signal must be 300 MHz or more. This value is not actually practical.

SUMMARY OF THE INVENTION

It is an object of the present invention to provide a clock signal regeneration method and a clock signal regeneration apparatus by which phase control of a regenerated clock signal can be performed at a step smaller than the width of one clock of a controlling clock signal to improve the accuracy in rate of the regenerated clock signal to reduce phase jitters readily even with a high speed system.

In order to attain the object described above, according to an aspect of the present invention, there is provided a clock signal regeneration method for regenerating a clock signal synchronized with received data, which comprises the steps of extracting, from the received data, a timing signal corresponding to a rate of the received data, comparing the phases of the thus extracted timing signal and a regenerated clock signal with each other to produce a phase difference signal corresponding to the phase difference between the timing signal and the regenerated clock signal, repetitively adding the phase difference signal at each clock of the regenerated clock signal in a cycle of a controlling clock signal whose frequency is higher than that of the timing signal to produce a phase difference integrated value for each of such adding operation, converting the phase difference integrated value into amplitude information by which an amplitude of a sine waveform is represented in a digital value, converting the amplitude information into an analog signal, and comparing the analog signal with a reference voltage to produce a new regenerated clock signal robe outputted as a regenerated clock signal and to be used at the first comparing step in a next cycle.

Preferably, at the repetitively adding step, a predetermined bias value is added to the phase difference signal.

Amplitude information in which amplitudes of the sine waveform are represented in digital values may be stored in advance in storage means, and the amplitude information may be read out from the storage means designating the phase difference integrated value as a read address for the storage means.

Preferably, high frequency components are removed from the phase difference signal obtained at the first comparing step, and high frequency components are removed from the analog signal obtained at the second converting step.

According to another aspect of the present invention, there is provided a clock signal regeneration apparatus for regenerating a clock signal synchronized with received data, which comprises a timing extraction circuit for extracting, from the received data, a timing signal corresponding to a rate of the received data, a phase comparator for comparing the phases of the timing signal extracted by the timing extraction circuit and a regenerated clock signal with each other to produce a phase difference signal corresponding to the phase difference between the timing signal and the regenerated clock signal, integration means for repetitively adding the phase difference signal at each clock of the regenerated clock signal in a cycle of a controlling clock signal whose frequency is higher than that of the timing signal to produce a phase difference integrated value for each of such adding operation, amplitude information conversion means for converting the phase difference integrated value into amplitude information by which an amplitude of a sine waveform is represented in a digital value, digital to analog conversion means for converting the amplitude information into an analog signal, and waveform shaping means for comparing the analog signal with a reference voltage to produce a new regenerated clock signal to be outputted as a regenerated clock signal from the clock signal regeneration apparatus and to be supplied to the phase comparator.

With the clock signal regeneration method and apparatus, where the frequency of the controlling clock signal is equal to N times that of the timing signal extracted from the received data, the phase difference signal for each clock of the regenerated clock signal is repetitively added at a rate equal to N times that of the timing signal to obtain a phase difference integrated value for each of such adding operation. The phase difference integration value is incremented by a value corresponding to the phase difference in a cycle equal to 1/N of the cycle of the received data, that is, equal to one cycle of the controlling clock signal, and for each phase difference integrated value, the amplitude of the sine waveform is converted into amplitude information represented in a digital value. The amplitude information is converted into an analog signal, and the analog signal is compared with a reference voltage to shape it by waveform shaping thereby to obtain a new regenerated clock signal which has been corrected in phase. While also the amplitude information is obtained in the same cycle as that of the controlling clock signal, since the phase of the regenerated clock signal obtained newly is based on the analog signal obtained by converting a digital value of the amplitude of the sine waveform into an analog value by digital to analog conversion, the phase control width of one step is not fixed to a value whose minimum limit is 1/N of the cycle of the controlling clock signal as in conventional clock signal regeneration apparatus, but can be varied at a smaller step than 1/N of the cycle.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 5 is a time chart illustrating output waveforms of the integrator, a D/A converter, a low-pass filter and a comparator of the clock signal regeneration apparatus of FIG. 1;

FIG. 7 is a diagrammatic view illustrating a read address of the sine wave regeneration ROM and a sampling output with respect to a sine waveform;

DESCRIPTION OF THE PREFERRED EMBODIMENT

Figure 1:
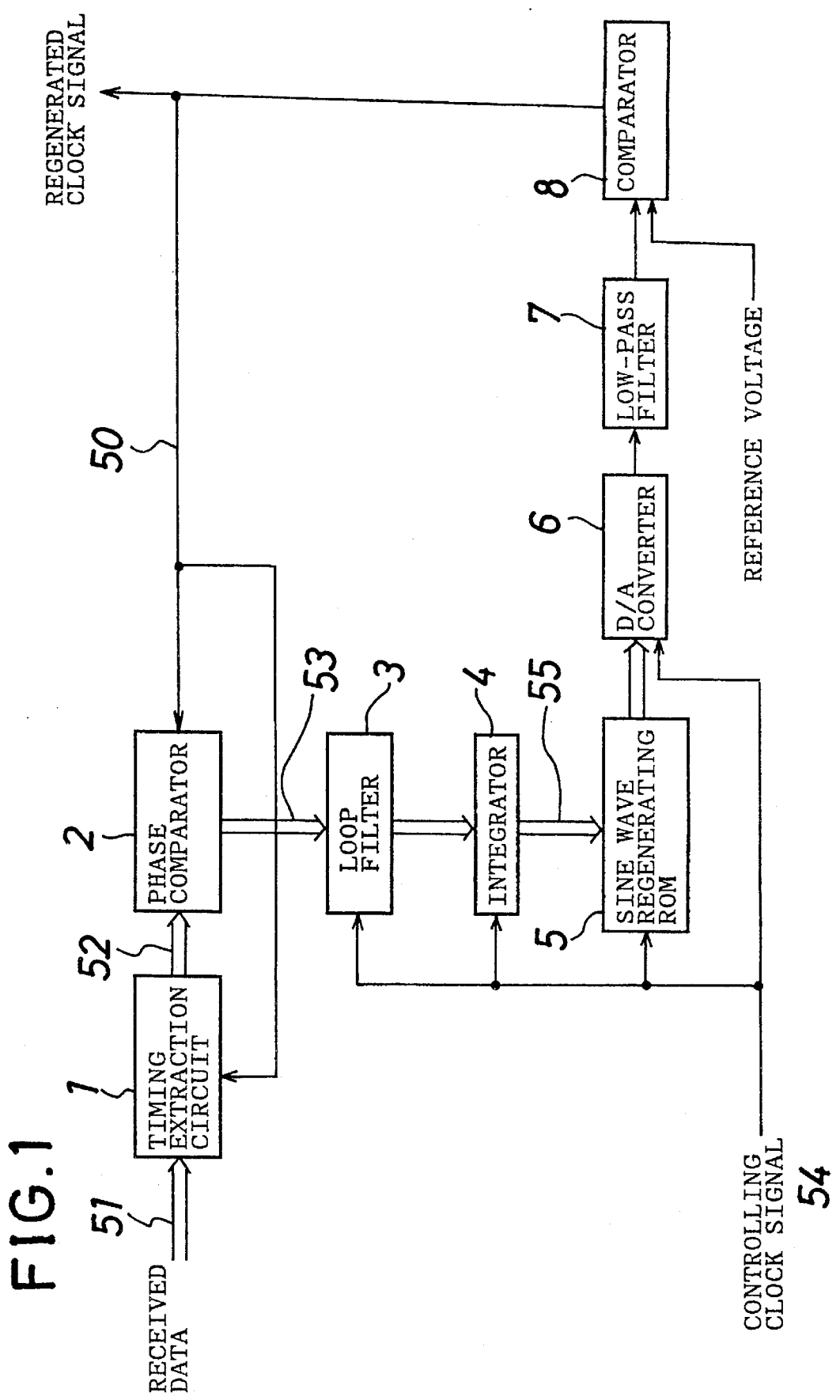
FIG. 1 is a block diagram of a clock signal regeneration apparatus showing a preferred embodiment of the present invention.

Referring first to FIG. 1, there is shown a clock signal regeneration apparatus to which the present invention is applied. Referring to FIG. 1, the clock signal regeneration apparatus shown includes a timing extraction circuit 1, a phase comparator 2, a loop filter (low-pass filter) 3, an integrator 4, a sine wave regenerating ROM 5, a digital to analog (D/A) converter 6, a low-pass filter 7 and a comparator 8. The clock signal regeneration apparatus has the construction of a PLL circuit wherein the output of the comparator 8 is fed back as a regenerated clock signal 50 to the phase comparator 2.

The timing extraction circuit 1 extracts, from received data 51 in the form of a digitally modulated signal, a timing signal 52 corresponding to the rate of the received data 51. The phase comparator 2 compares the phases of the timing signal 52 from the timing extraction circuit 1 and the regenerated clock signal 50 with each other and outputs a phase difference signal 53 of a voltage corresponding to the phase difference between the timing signal 52 and the regenerated clock signal 50. Exemplary circuit constructions of the timing extraction circuit 1 and the phase comparator 2 are shown in FIG. 2, and operations of components of them are illustrated in FIG. 3, in which the received data 51 are indicated in a waveform after D/A conversion and in another waveform after removal of high frequency components from the analog waveform.

Figure 2:
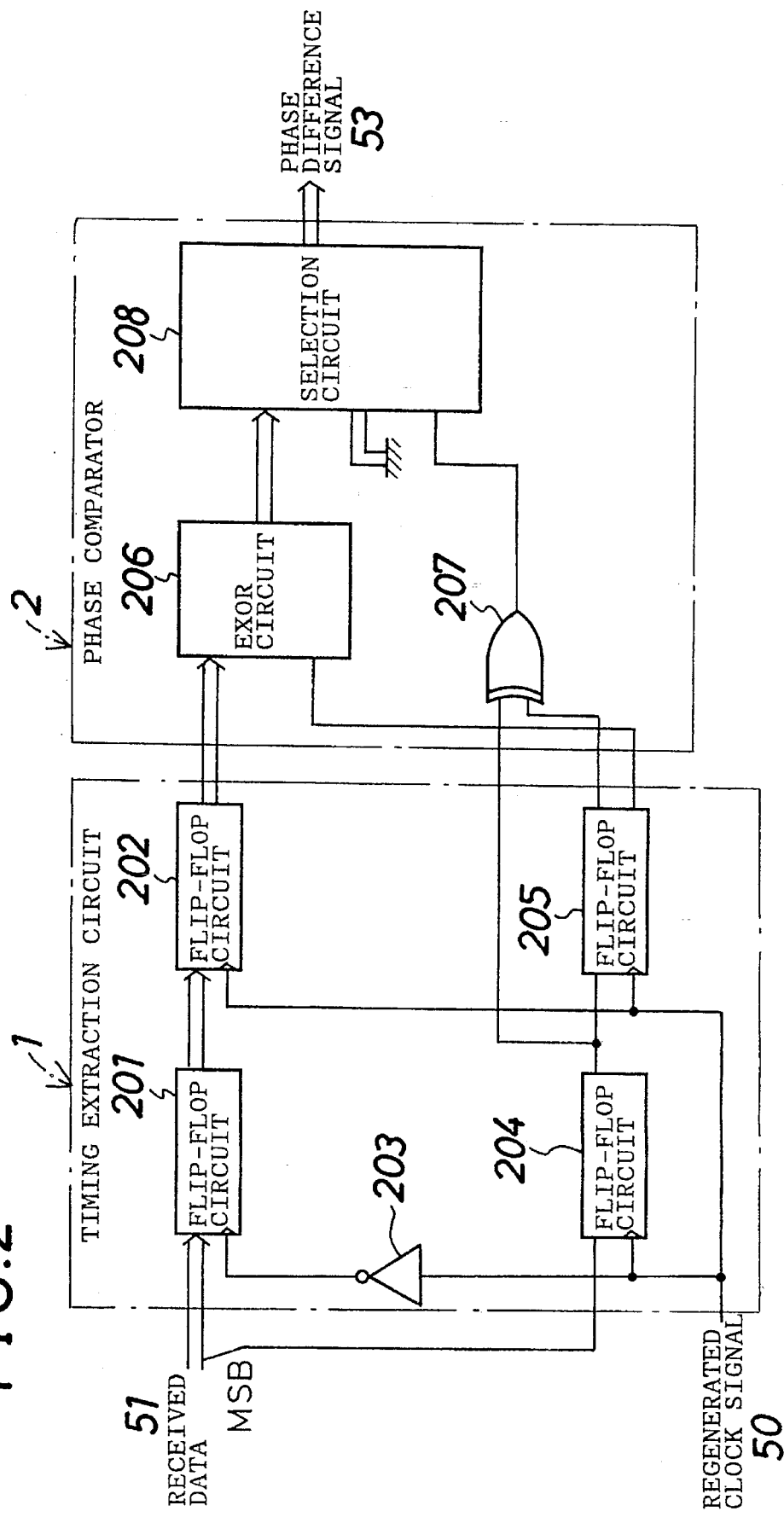
FIG. 2 is a block diagram showing exemplary circuit constructions of a timing extraction circuit and a phase comparator of the clock signal regeneration apparatus of FIG. 1.

Referring to FIG. 2, the timing extraction circuit 1 includes a flip-flop circuit 201 to which the received data 51 are inputted, another flip-flop circuit 202 for receiving the output of the flip-flop circuit 201, an invertor 203 for inverting the regenerated clock signal 50, a further flip-flop circuit 204 for receiving a most significant bit (MSB) of the received data 51, and a still further flip-flop circuit 205 for receiving the output of the flip-flop circuit 204. The regenerated clock signal 50 is inputted as it is to the flip-flop circuits 202, 204 and 205 while the output of the invertor 203 which inverts the regenerated clock signal 50 is inputted to the flip-flop circuit 201.

The phase comparator 2 includes an exclusive OR circuit 207 for receiving the output of the flip-flop circuit 204 and the output of the flip-flop circuit 205, another exclusive OR (EXOR) circuit 206 for receiving the output of the flip-flop circuit 202 and the inverted output of the flip-flop circuit 205, and a selection circuit 208 for selecting the output of the exclusive OR circuit 206 in response to the output of the exclusive OR circuit 207.

Figure 3:
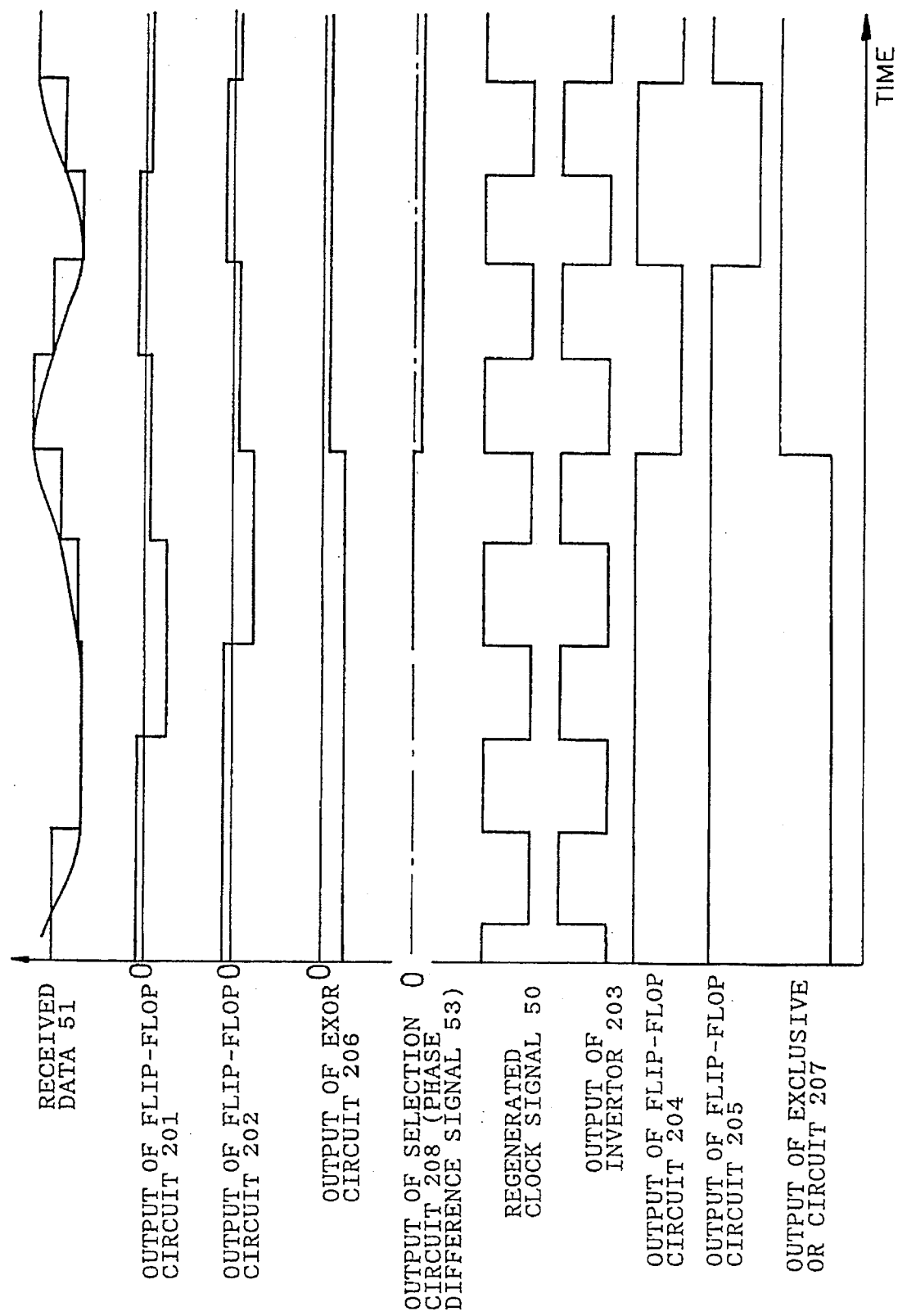
FIG. 3 is a time chart illustrating operation of the timing extraction circuit and the phase comparator shown in FIG. 2.

Referring also to FIG. 3, the flip-flop circuit 201 extracts the received data 51 at a rising edge of the output of the invertor 203 which inverts the regenerated clock signal 50, and provides, if the data then are displaced from the zero cross point, an output having a positive or negative polarity corresponding to the direction of the displacement and an amplitude corresponding to the magnitude of the displacement. The flip-flop circuit 202 delays the output of the flip-flop circuit 201 by an amount equal to the width of ½ clock of the regenerated clock signal. The flip-flop circuit 204 extracts a variation of the MSB of the received data 51 at a rising edge of the regenerated clock signal 50. The flip-flop circuit 205 delays the output of the flip-flop circuit 204 to a next rising edge of the regenerated clock signal 50. The exclusive OR circuit 206 exclusively ORs the output of the flip-flop circuit 202 and the inverted output of the flip-flop circuit 205 to control the output of the flip-flop circuit 205 to one of the positive and negative polarities. The exclusive OR circuit 207 exclusively ORs the output of the flip-flop circuit 204 and the output of the flip-flop circuit 205 and inputs a resulted output signal to the selection circuit 208. The selection circuit 208 selects the output of the exclusive OR circuit 206 when the output of the exclusive OR circuit 207 is "1", but selects zero when the output of the exclusive OR circuit 207 is "0", and outputs the selected value as a phase difference signal 53. The phase difference signal 53 exhibits a voltage according to a phase difference having a negative value when the phase of the regenerated clock signal 50 leads the phase of the received data 51 but having a positive value when the phase of the regenerated clock signal 50 lags the phase of the received data 51.

Referring back to FIG. 1, the loop filter 3 removes high frequency components from the phase difference signal 53 which is outputted from the phase comparator 2 at each clock of the regenerated clock signal. The integrator 4 repetitively or cumulatively adds the phase difference signal, from which high frequency components have been removed by the loop filter 3, in a cycle of a controlling clock signal 54 of a frequency equal to N times that of the timing signal, and outputs a phase difference integrated value 55 for each such adding operation. An exemplary circuit construction of the integrator 4 is shown in FIG. 4.

Figure 4:
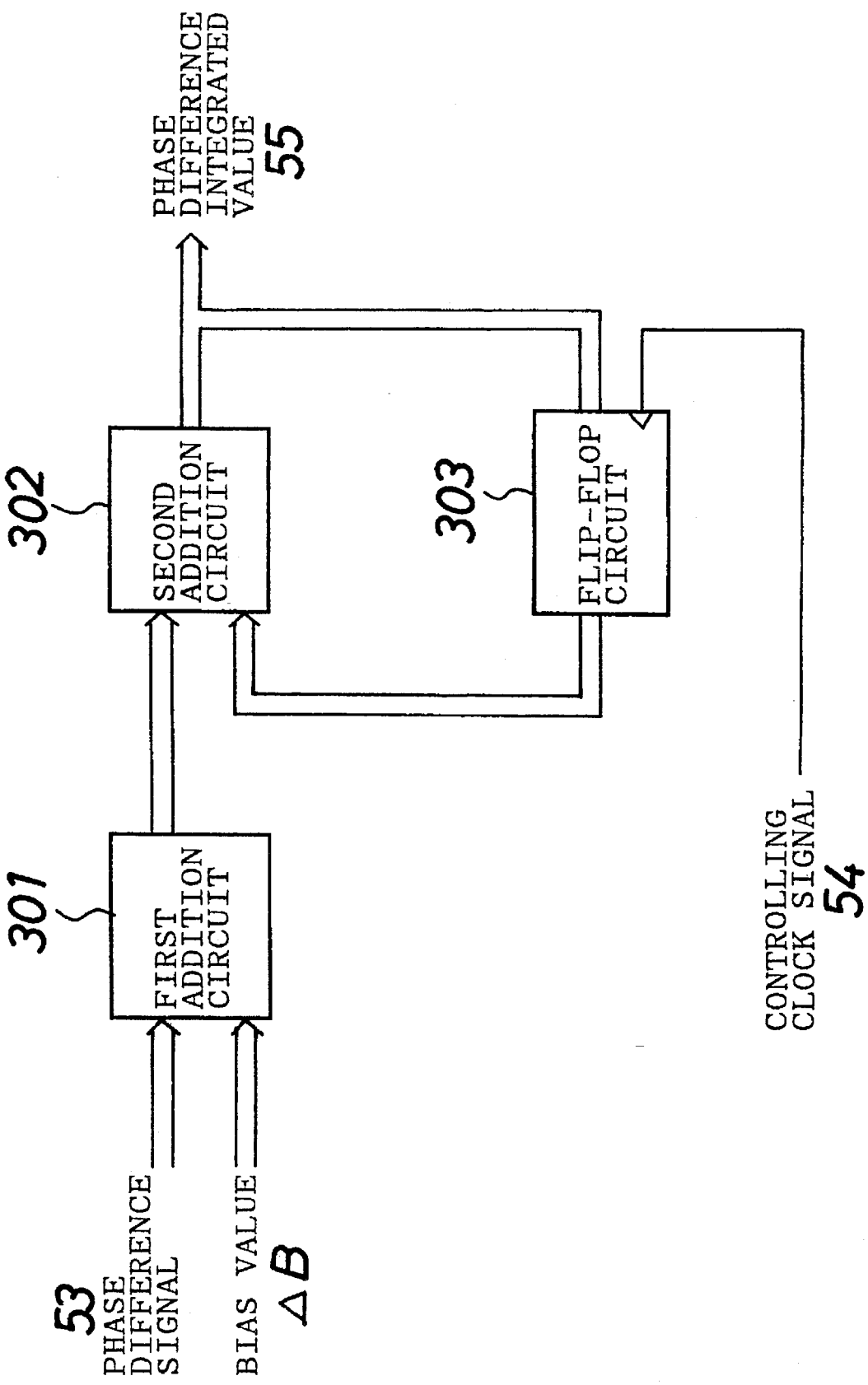
FIG. 4 is a block diagram showing an exemplary circuit construction of an integrator of the clock signal regeneration apparatus of FIG. 1.
Figure 8:
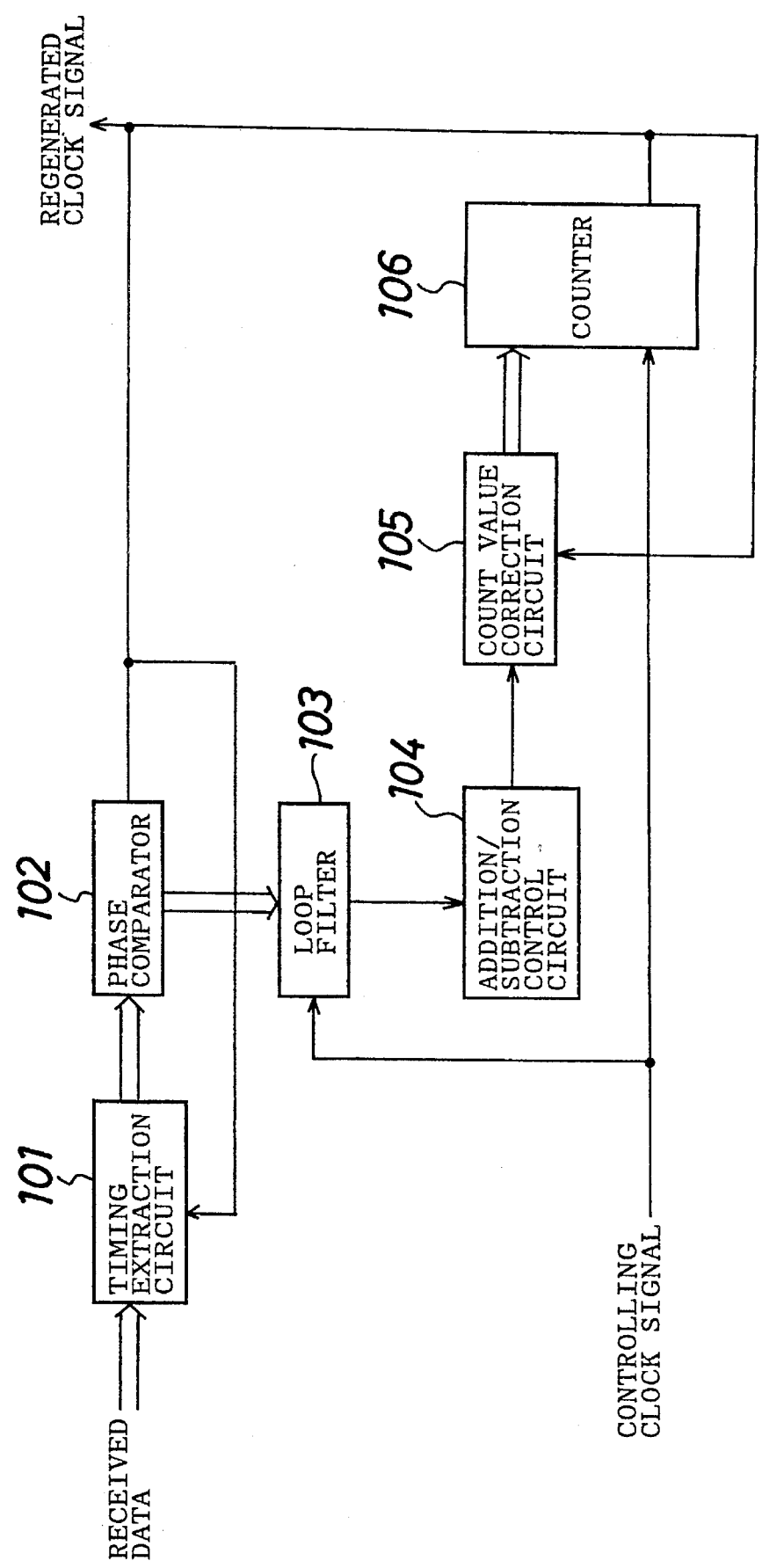
FIG. 8 is a block diagram showing a conventional clock signal regeneration apparatus.
Figure 9:
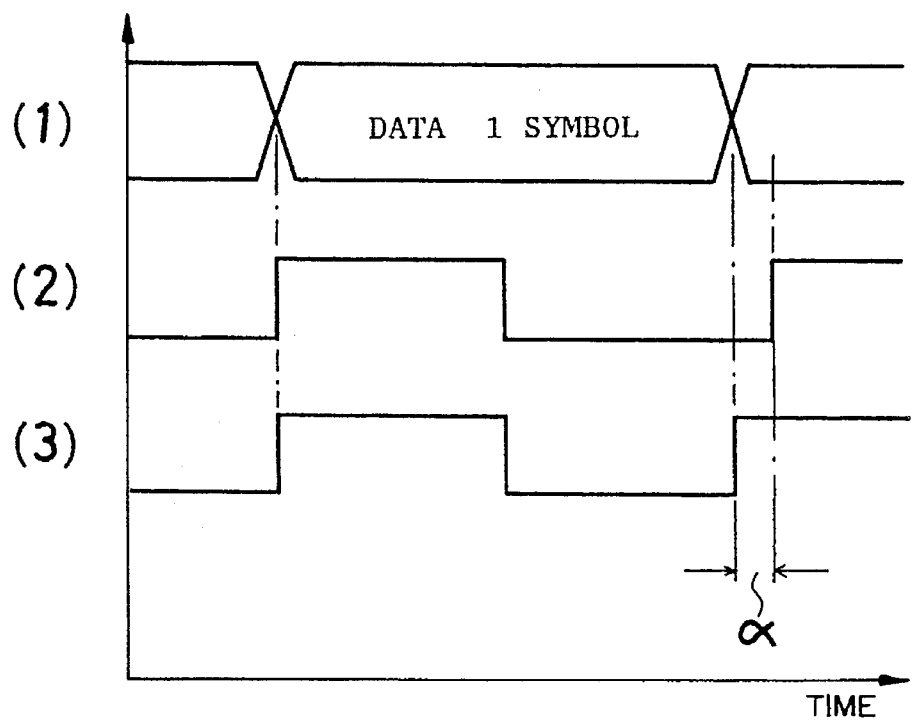
FIG. 9 is a time chart illustrating a limit in phase control for a regenerated clock signal of the conventional clock signal regeneration apparatus shown in FIG. 8.

Referring to FIG. 4, the integrator 4 shown includes two first and second addition circuits 301 and 302 and a single flip-flop circuit 303. The first addition circuit 301 adds a predetermined bias value ΔB to the phase difference signal 53 outputted from the loop filter 3 and outputs a resulted value to the second addition circuit 302. The flip-flop circuit 303 delays the output of the second addition circuit 302 by an amount equal to the width of one clock of the controlling clock signal 54 and outputs the delayed signal back to the second addition circuit 302. The second addition circuit 302 adds the thus inputted output of the flip-flop circuit 303 and the phase difference signal to which the bias value ΔB has been added by the first addition circuit 301. In other words, the second addition circuit 302 repetitively adds the phase difference signal, to which the bias value ΔB has been added, in a cycle of 1/N of the cycle at the data rate and outputs a result of each such adding operation as a phase difference integrated value 55 of the integrator 4 as seen from the time chart of FIG. 5. The phase difference integrated value 55 outputted in a cycle of 1/N of the cycle at the data rate is provided as a read address signal to the sine wave regenerating ROM 5. Here, if the address of the sine wave regenerating ROM 5 has, for example, an 8-bit configuration, only lower 8 bits of the phase difference integrated value 55 which is the output of the integrator 4 are referred to so that address designation may be performed repetitively in one cycle within which addresses beginning with the first address at which all of the eight bits are equal to "0" and ending with the last address at which all of the eight bits are equal to "1".

The sine wave regenerating ROM 5 stores in advance amplitudes of a sine waveform as table data of digital values. The sine wave regenerating ROM 5 receives the phase difference-integrated value 55 from the integrator 4 as a read address signal as described above and outputs sample data of the sine waveform corresponding to the address. Such reading out operation from the sine wave regenerating ROM 5 is synchronized with the controlling clock signal 54, but the maximum reading out rate is 1/N of the rate of the controlling clock signal 54. However, since the sample data of the sine waveform outputted from the sine wave regenerating ROM 5 are controlled in phase by a resolution corresponding to the bit length of the address of the sine wave regenerating ROM 5, the phase can be varied at a finer step than the step at 1/N of the rate of the controlling clock signal 54.

Figure 6:
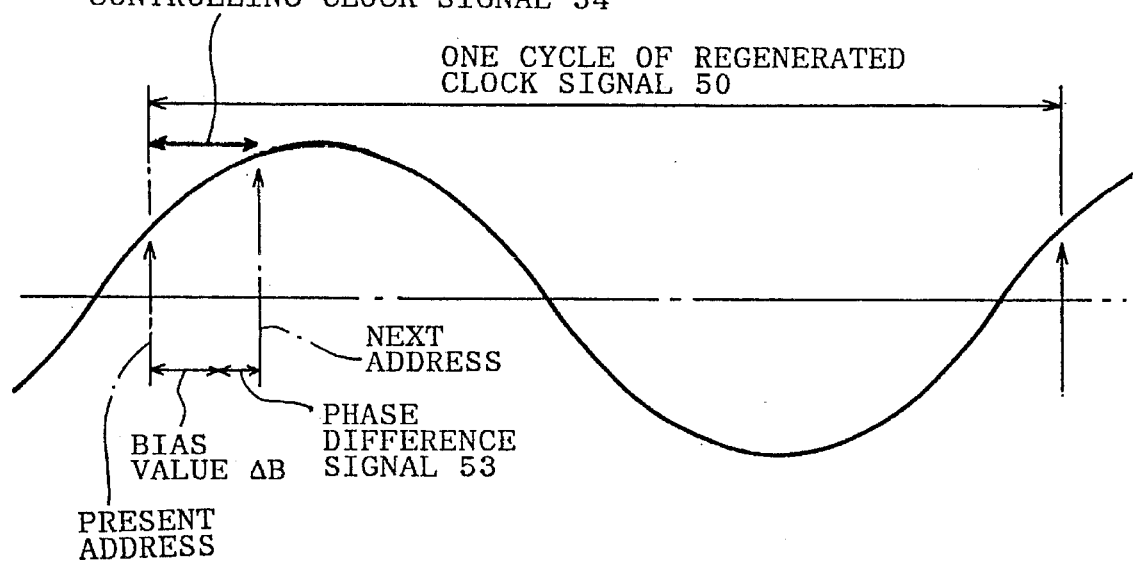
FIG. 6 is a diagrammatic view illustrating the relationship between an integrating operation of the integrator of FIG. 4 and an address of a sine wave regeneration ROM designated by the output of the integrator.

FIG. 6 illustrates the relationship between the integrating operation of the integrator 4 and the address of the sine wave regenerating ROM 5 designated by the output of the integrator 4. The read address for the sine wave regenerating ROM 5 is incremented by a value equal to the sum of the phase difference signal 53 and the bias value ΔB.

FIG. 7 illustrates the relationship of the read address and the sampling output of the sine wave regenerating ROM 5 to the sine waveform. The read address and the sampling output are represented in 8 bits, and amplitude information is stored for addresses between the address where all of the 8 bits of the read address are "0" and the address where all of the 8 bits of the read address are "1", thereby constituting one cycle of the sine wave. The sampling output corresponding to the sine waveform exhibits a maximum amplitude point at [11111111], a minimum amplitude point at [00000000] and a middle amplitude point at [10000000]. Further, where the rate of the controlling clock signal 54 is set to four times (N=4) the data rate, the bias value ΔB is given as an address [01000000] which corresponds to the point of 90 degrees of the sine waveform.

Referring back to FIG. 1, the D/A converter 6 converts such a digital sampling output of the sine wave regenerating ROM 5 as described above into an analog voltage in a cycle (1/N of the cycle of the received data 51) of the controlling clock signal 54. The output of the D/A converter 6 exhibits such a stepped waveform whose amplitude varies in a cycle equal to 1/N of the cycle of the received data 51 as shown in FIG. 5. The low-pass filter 7 removes high frequency components from the output of the D/A converter 6 and outputs a resulted signal as a sine wave whose phase varies delicately or finely. The comparator 8 compares the sine wave outputted from the low-pass filter 7 with a reference voltage to shape the sine wave by waveform shaping and outputs a resulted signal as a new regenerated clock signal whose phase varies finely.

FIG. 5 illustrates exemplary output waveforms of the integrator 4, the D/A converter 6, the low-pass filter 7 and the comparator 8 when the frequency of the controlling clock signal 54 is set to four times the data rate. In FIG. 5, a left side portion illustrates those output waveforms where the rate of the received data 51 is equal to the rate $f_0$ of the regenerated clock signal 50; a middle portion illustrates those output waveforms where the rate of the received data 51 is lower than the rate $f_0$ of the regenerated clock signal 50; and a right portion illustrates those output waveforms where the rate of the received data 51 is higher than the rate $f_0$ of the regenerated clock signal 50. The sum value (output of the first addition circuit 301 in FIG. 4) of the integrator 4 for each adding operation varies depending upon the magnitude in phase difference between the timing signal 52 extracted from the received data 51 and the regenerated clock signal 50. When the "received data rate $=f_0$", since the phase difference is 0, the sum value of the integrator 4 is equal to the bias value $\Delta B$; when the "received data rate $<f_0$", since the phase difference is negative in sign, the sum value is lower than the bias value $\Delta B$; and when the "received data rate $>f_0$", since the phase difference is positive in sign, the sum value is higher than the bias value $\Delta B$.

The magnitude of the sum value appears as the degree of the slope of the output waveform of the integrator 4. The time in which all of the addresses of the sine wave regenerating ROM 5 are designated once is varied by the variation of the slope, and the variation of the sampling output corresponding to the read address illustrated in FIG. 7 is varied accordingly. The variation of the sampling output appears as a variation in cycle of the sine wave at the output of the D/A converter 6. The output of the D/A converter 6 is passed through the low-pass filter 7 to extract a basic waveform component, and the thus extracted basic waveform component is compared with the reference voltage by the comparator 8. The output waveform of the comparator 8 makes a new regenerated clock signal whose phase varies with a displacement smaller than the width (1/N of the width of one symbol of the received data 51) of one clock of the controlling clock signal 54 as seen from FIG. 5.

Having now fully described the invention, it will be apparent to one of ordinary skill in the art that many changes and modifications can be made thereto without departing from the spirit and scope of the invention as set forth herein.

What is claimed is:

1. A clock signal regeneration method for producing a regenerated clock signal synchronized with digitally modulated received data, comprising the steps of:

extracting, from the digitally modulated received data, a timing signal corresponding to a rate of the digitally modulated received data;

comparing a phase of the timing signal with a phase of the regenerated clock signal to produce a phase difference signal corresponding to phase difference between the timing signal and the regenerated clock signal at each clock of the regenerated clock signal;

repetitively adding the phase difference signal at said each clock of the regenerated clock signal in a cycle equal to 1/N times a cycle of the timing signal with a controlling clock signal whose frequency is equal to N times that of the timing signal to produce a phase difference integrated value for each of such adding operation, wherein N is an integer;

converting the phase difference integrated value into amplitude information by which an amplitude of a sine waveform is represented by a digital value;

converting the amplitude information into an analog signal having a varying sine waveform; and comparing the analog signal with a reference voltage to produce a new regenerated clock signal having a phase which varies by a step size smaller than the 1/N times the cycle of the timing signal, said new regenerated clock signal to be outputted as a the regenerated clock signal and to be used at the first comparing step in a next cycle.

2. A clock signal regeneration method as claimed in claim 1, wherein, at the repetitively adding step, a predetermined bias value is added to the phase difference signal.

3. A clock signal regeneration method as claimed in claim 1, wherein amplitude information in which amplitudes of the sine waveform are represented by digital values is stored in advance in storage means, and the amplitude information is read out from said storage means designating the phase difference integrated value as a read address for said storage means.

4. A clock signal regeneration method as claimed in claim 1, further comprising the steps of removing high frequency components from the phase difference signal obtained at the first comparing step, and removing high frequency components from the analog signal obtained at the second converting step.

5. A clock signal regeneration apparatus for producing a regenerated clock signal synchronized with digitally modulated received data, comprising:

timing signal extraction means for extracting, from the digitally modulated received data, a timing signal corresponding to a rate of the digitally modulated received data;

phase comparison means for comparing a phase of the timing signal with a phase of the regenerated clock signal to produce a phase difference signal corresponding to a phase difference between the timing signal and the regenerated clock signal at each clock of the regenerated clock signal;

phase difference integration means for repetitively adding the phase difference signal at said each clock of the regenerated clock signal in a cycle equal to 1/N times a cycle of the timing signal with a controlling clock signal whose frequency is equal to N times that of the timing signal to produce a phase difference signal integrated value for each of such adding operation, wherein N is an integer;

amplitude information conversion means for converting the phase difference integrated value into amplitude information by which an amplitude of a sine waveform is represented by a digital value;

digital to analog conversion means for converting the amplitude information into an analog signal having a varying sine waveform; and waveform shaping means for comparing the analog signal with a reference voltage to produce a new regenerated clock signal having a phase which varies by a step size smaller than the 1/N times the cycle of the timing signal, said new regenerated clock signal to be outputted as the regenerated clock signal and to be supplied to said phase comparison means in a next cycle.

6. A clock signal regeneration apparatus as claimed in claim 5, wherein said amplitude information conversion means includes a sine wave regenerating read only memory in which the amplitude information of the sine waveform is stored, and the amplitude information is read out from said sine wave regenerating read only memory designating the phase difference integrated value as a read address for said sine wave regenerating read only memory.

7. A clock signal regeneration apparatus as claimed in claim 5, further comprising a first filter for removing high frequency components from the phase difference signal from said phase comparison means, and a second filter for removing high frequency components from the analog signal from said digital to analog conversion means.

8. A clock signal regeneration apparatus for producing a regenerated clock signal synchronized with digitally modulated received data, comprising:

a timing extraction circuit configured to extract, from the digitally modulated received data, a timing signal corresponding to a rate of the digitally modulated received data;

a phase comparator configured to receive the timing signal from the timing extraction circuit and the regenerated clock signal, said phase comparator operable to compare a phase of the timing signal with a phase of the regenerated clock signal and to produce a phase difference signal corresponding to a phase difference between the timing signal and the regenerated clock signal at each clock of the regenerated clock signal;

a phase difference integration circuit configured to receive the phase difference signal from the phase comparator and a controlling clock signal, said phase difference integration circuit operable to repetitively add the phase difference signal at said each clock of the regenerated clock signal in a cycle equal to 1/N times a cycle of the timing signal with the controlling clock signal whose frequency is equal to N times that of the timing signal to produce a phase difference signal integrated value for each of such adding operation, wherein N is an integer;

an amplitude information conversion circuit configured to receive the phase difference signal integrated value from the phase difference integration circuit and the controlling clock signal, said amplitude information conversion circuit operable to convert the phase difference signal integrated value into amplitude information by which an amplitude of a sine waveform is represented by a digital value;

a digital to analog convertor configured to receive the amplitude information from the amplitude information conversion circuit and the controlling clock signal, said digital to analog converter operable to convert the amplitude information into an analog signal having a varying sine waveform; and a waveform shaping circuit configured to receive the analog signal from the digital to analog converter and a reference voltage, said waveform shaping circuit operable to compare the analog signal with the reference voltage to produce a new regenerated clock signal having a phase which varies by a step size smaller than the 1/N times the cycle of the timing signal, said new regenerated clock signal to be outputted as the regenerated clock signal and to be supplied to said phase comparator in a next cycle.

9. A clock signal regeneration apparatus as claimed in claim 8, wherein said amplitude information conversion circuit includes a sine wave regenerating read only memory in which the amplitude information of the sine waveform is stored, and the amplitude information is read out from the sine wave regenerating read only memory designating the phase difference integrated value as a read address for said sine wave regenerating read only memory.

10. A clock signal regeneration apparatus as claimed in claim 8, further comprising:

a first filter coupled to the phase comparator and configured to remove frequency components above a first predetermined frequency from the phase difference signal; and a second filter coupled to the digital to analog converter and configured to remove frequency components above a second predetermined frequency from the analog signal.

11. A clock signal regeneration apparatus as claimed in claim 10, wherein the first predetermined frequency is equal to the second predetermined frequency.

12. A clock signal regeneration apparatus as claimed in claim 10, wherein the first filter is a loop filter.

13. A clock signal regeneration apparatus as claimed in claim 8, wherein the timing extraction circuit includes:

an inverter configured to receive the regenerated clock signal and to output an inverted regenerated clock signal;

a first flip-flop circuit configured to receive the digitally modulated received data and the inverted regenerated clock signal, said first flip-flop circuit operable to sample the digitally modulated received data at a rising edge of the inverted regenerated clock signal as a first sampled signal;

a second flip-flop circuit configured to receive the first sampled signal from the first flip-flop circuit and the regenerated clock signal, said second flip-flop circuit operable to delay the first sampled signal by an amount equal to a width of one-half a clock of the regenerated clock signal and to output a second sampled signal as a result thereof;

a third flip-flop circuit configured to receive a most-significant bit of the digitally modulated received data and the regenerated clock signal, said third flip-flop circuit operable to sample the most-significant bit of the digitally modulated received data at a rising edge of the regenerated clock signal as a third sampled signal; and a fourth flip-flop circuit configured to receive the third sampled signal from the third flip-flop circuit and the regenerated clock signal, said fourth flip-flop circuit operable to delay the third sampled signal by the amount equal to a width of one-half a clock of the regenerated clock signal and to output a fourth sampled signal as a result thereof.

14. A clock signal regeneration apparatus as claimed in claim 13, wherein the phase comparator includes:

a first exclusive-or circuit coupled to receive the second sampled signal and the fourth sampled signal and operable to output a first exclusive-or signal as a result thereof;

a second exclusive-or circuit coupled to receive the third sampled signal and the fourth sampled signal and operable to output a second exclusive-or signal as a result thereof; and a selection circuit coupled to a reference voltage, the first exclusive-or circuit and the second exclusive-or circuit, said selection circuit operable to output one of the first exclusive-or signal and the reference voltage in response to a state of the second exclusive-or signal, wherein the output of the selection circuit corresponds to the phase difference signal.

15. A clock signal regeneration apparatus as claimed in claim 14, wherein the selection circuit outputs the first exclusive-or signal when the second exclusive-or signal is "1" and outputs a zero value when the second exclusive-or signal is "0".

* * * * *